United States Patent [19]
Zhang

[11] Patent Number: 5,994,946
[45] Date of Patent: Nov. 30, 1999

[54] ALTERNATING INVERTERS FOR CAPACITIVE COUPLING REDUCTION IN TRANSMISSION LINES

[75] Inventor: Xiaonan Zhang, San Diego, Calif.

[73] Assignee: Metaflow Technologies, Inc., La Jolla, Calif.

[21] Appl. No.: 08/742,109

[22] Filed: Oct. 31, 1996

[51] Int. Cl.$^6$ ............................ H03K 17/62; H03H 11/26
[52] U.S. Cl. ............................................ 327/403; 327/261
[58] Field of Search ..................................... 327/108, 164, 327/333, 261, 269–272, 276–278, 284–285, 310, 389, 403

[56] References Cited

U.S. PATENT DOCUMENTS

| | | | |
|---|---|---|---|
| 4,403,192 | 9/1983 | Williman | 327/403 |
| 4,718,063 | 1/1988 | Reedy et al. | 327/403 |
| 4,890,022 | 12/1989 | Endo | 327/403 |
| 5,420,534 | 5/1995 | Elabd | 327/403 |
| 5,489,867 | 2/1996 | Tamanoi | 327/269 |
| 5,532,630 | 7/1996 | Waggoner et al. | 327/108 |

FOREIGN PATENT DOCUMENTS 517541   9/1992   European Pat. Off. .

OTHER PUBLICATIONS

Deverell, J., "Generation of Sines and Cosines Using Iterative Arrays", Electronic Letters, vol. 7, No. 20 (Oct. 1971), pp. 616–618.

Hwang et al., "Evaluating Elementary Functions with Chebyshev Polynomials on Pipeline Nets", IEEE Trans. Comp., vol. ch–24, No. –19, 1987, pp. 121–128.

*Primary Examiner*—My-Trang Nu Ton
*Attorney, Agent, or Firm*—Theodore E. Galanthay; Lisa K. Jorgenson; Steven A. Swernofsky

[57] ABSTRACT

The invention provides a method and system for reducing capacitive coupling for transmission lines. Where there is a plurality of parallel transmission lines, a first half of the transmission lines (every second one) are inverted at their driving points, and are reinverted at a half-way point between their driving points and their receiving points, using an inverter placed halfway along the transmission line. A second half of the transmission lines are inverted at the half-way point, and are reinverted at their receiving points. Thereby, every second one of multiple transmission lines is inverted at any point in the transmission line, causing capacitive coupling to self-cancel across the entire transmission line, reducing crosstalk and speeding rise time.

17 Claims, 2 Drawing Sheets

5,994,946

ALTERNATING INVERTERS FOR CAPACITIVE COUPLING REDUCTION IN TRANSMISSION LINES

BACKGROUND OF THE INVENTION

1. Field of the Invention

This invention relates to reducing capacitive coupling for transmission lines, particularly wires in submicron VLSI chips.

2. Description of Related Art

When multiple transmission lines (such as wires in semiconductor chips) are coupled in parallel between driving points and receiving points, capacitive coupling can occur between pairs of those transmission lines.

Capacitive coupling can cause crosstalk between pairs of transmission lines. Crosstalk between pairs of transmission lines can slow rise time of transmission lines which differ in logic value from nearby transmission lines; crosstalk between pairs of transmission lines can alternatively delay or speed rise time of transmission lines which have the same logic value as nearby transmission lines, causing delay of arrival of logic values in some of a plurality of transmission lines. In circuit design for a plurality of transmission lines, the designer must design the circuit to work even in the worst-case scenario; this can add unnecessarily to the design effort, or result in circuits which are inefficient or wasteful.

In deep submicron technologies such as 0.5 micron and below, wire resistance for transmission lines is larger, capacitance between the transmission line and the semiconductor substrate is larger, and the capacitance between pairs of transmission lines is larger. Capacitance between pairs of transmission lines can be over 80% of the total capacitance of the total capacitance for each transmission line. Capacitive coupling is severely exacerbated for mutliple parallel wires, particularly when those wires are longer than about 3 millimeters.

One known method for speeding up rise time of signals to be transmitted on transmission lines is to couple the transmission lines to stronger drivers. This can overcome the wire capacitance of the transmission line and decrease the time needed to change the voltage at the receiving point of the transmission line, and thus decrease the time needed to transmit a logic value from the driving point to the receiving point. However, the problems posed by capacitive coupling are not ameliorated by use of stronger drivers, due to wire resistance.

Moreover, the inventor has found that rise time can vary greatly in response to the timing of changes in different signals transmitted on pairs of transmission lines. Delay induced by capacitive coupling can be far greater when different signals on different transmission lines are switched at slightly different times, rather than simultaneously. Simulations show that a change in skew of only about 200 picoseconds can cause a change in the amount of delay by over 280 picoseconds.

A second known method for speeding up rise time is to provide repeaters at intermediate locations in the transmission lines. This can overcome some of the wire impedance and decrease the time needed to change the voltage at the receiving point of the transmission line, and thus decrease the time needed to transmit a logic value from the driving point to the receiving point. However, this method does not eliminate the problem because crosstalk still occurs on both sides of the repeater.

Accordingly, it would be advantageous to provide a technique for reducing capacitive coupling for transmission lines.

SUMMARY OF THE INVENTION

The invention provides a method and system for reducing capacitive coupling for transmission lines. A pair of parallel transmission lines, such as wires, have a first transmission line in which the signal is inverted at a part-way point, and a second transmission line in which the signal is not inverted at that part-way point. Capacitive coupling is reduced because its effect before the inversion point is offset by an inverse effect after the inversion point, reducing cross-talk and speeding rise time. In a preferred embodiment, there may be more than one inversion point.

DESCRIPTION OF THE PREFERRED EMBODIMENT

In a first preferred embodiment, described with reference to FIG. 1, crosstalk between transmission lines is minimized by causing adjacent pairs of transmission lines to have opposite signal polarity for half the extent of the transmission lines and similar signal polarity for half the extent of the transmission lines.

Figure 1:
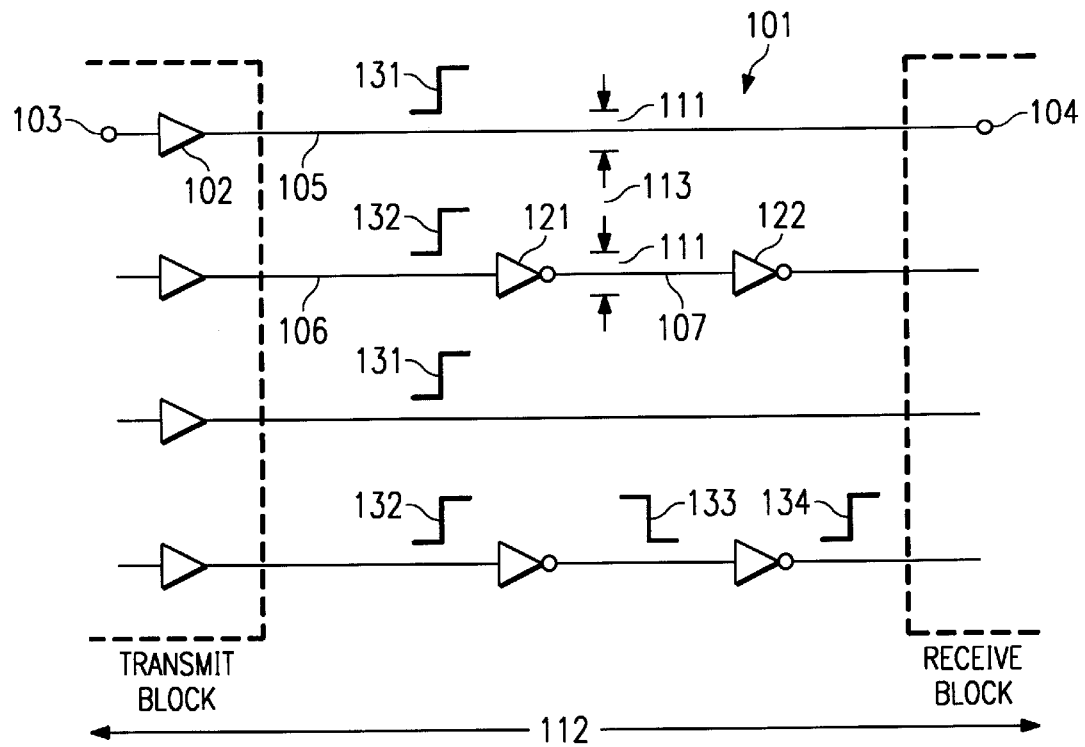
FIG. 1 shows a first set of transmission lines in which crosstalk is minimized.

FIG. 1 shows a first set of transmission lines in which crosstalk is minimized.

A plurality of transmission lines 101 each transmits a signal from a driver 102 at a driving point 103 in a circuit to a receiving node at a receiving point 104 in a circuit. Each signal is a digital signal and encodes one bit of information using one of two voltage values, a logic "0" value (such as +0.0 volts) to indicate a "0" bit and a logic "1" value (such as +5.0 volts) to indicate a "1" bit.

In a preferred embodiment, each transmission line 101 comprises a conductor 105. In a preferred embodiment, each transmission line 101 has a width 111 of between about 0.2 microns (um) to about 0.5 um, such as about 0.3 um. Each transmission line 101 has a length 112 which is determined by a distance between the driving point 103 to the receiving point 104, and which in a preferred embodiment may be anywhere from about 1 cm to about 15 cm. In a preferred embodiment, a distance 113 between pairs of transmission lines 101 is similar to the width 111 of the transmission lines 101, such as about 0.3 um.

A first set of transmission lines 101 comprises just the driver 102 and the conductor 105. In a preferred embodiment, the first set of transmission lines 101 comprises every other transmission line 101, such as all even numbered transmission lines 101 when the transmission lines 101 are numbered.

For the first set of transmission lines 101, an original signal appearing at the driving point 103 is coupled by the driver 102 onto the conductor 105 and transmitted to the receiving point 104 without change.

A second set of transmission lines 101 (such as all odd numbered transmission lines 101 when the transmission lines 101 are numbered), comprises a balancing inverter 121 disposed about midway between the driving point 103 and the receiving point 104, and a restoring inverter 122 disposed near the receiving point 104. The balancing inverter 121 is disposed so as to divide the conductor 105 into two parts, a first part 106 nearer the driving point 103 and a second part 107 nearer the receiving point 104.

For the second set of transmission lines 101, the original signal appearing at the driving point 103 is coupled by the driver 102 onto the first part 106 of the conductor 105 without change. The first part 106 of the conductor 105 couples the signal to the balancing inverter 121, which inverts the signal and couples an inverted signal to the second part 106 of the conductor 105. The second part 106 of the conductor 105 couples the inverted signal to the restoring inverter 122, which re-inverts the inverted signal to restore the original signal and couples the restored original signal to the receiving point 104.

Effect on Capacitive Coupling

A first original signal 131 for a first transmission line 101 comprises a first digital signal which encodes one bit of information using one of two voltage values, the logic "0" value to indicate a "0" bit and the logic "1" value to indicate a "1" bit. The first original signal 131 is shown having a transition from a "0" bit to a "1" bit, but the first original signal 131 could just as well have a transition from a "0" bit to a "1" bit, or be a constant "0" bit or a constant "1" bit.

Similarly, a second original signal 132 for a second transmission line 101 comprises a first digital signal which encodes one bit of information using one of two voltage values.

The first original signal 131 is shown for the first plurality of transmission lines 101, even though the actual logical value of those signals will not necessarily be identical. Similarly, the second original signal 132 is shown for the second plurality of transmission lines 101, even though the actual logical value of those signals will not necessarily be identical.

For the second plurality of transmission lines 101, the second original signal 132 is inverted by the balancing inverter 121, providing an inverted signal 133. The inverted signal 133 is re-inverted by the restoring inverter 122, providing a restored signal 134.

When the first original signal 131 changes polarity, capacitive coupling between the first transmission line 101 and the second transmission line 101 (more generally, between any pair of adjacent transmission lines 101 or even any pair of transmission lines 101) may cause increased or decreased rise time or fall time for voltage propagated along the transmission line 101, and thus may delay (or speed up) transmission of the first original signal 131 from the driving point 103 to the receiving point 104.

The amount of delay may vary significantly when the first original signal 131 changes polarity nearly simultaneously with the second original signal 132. In contrast with intuition, the amount of delay may vary significantly with slight changes in the arrival time of polarity changes to the first original signal 131 and the second original signal 132.

However, the balancing inverter 121 and the restoring inverter 122 cause the polarities of voltages on the first transmission line 101 and the second transmission line 101 to have the same polarity for half the distance 112 and the opposite polarity for half the distance 112. This condition obtains whether the first original signal 131 and the second original signal 132 have the same polarity or the opposite polarity. As a consequence, the amount of delay is minimized when polarity changes for the first original signal 131 (more generally, any original signal appearing at one of the drivers 102), and the amount of variance in delay is minimized when polarity changes for both the first original signal 131 and the second original signal 132 (more generally, original signals appearing at any pair of the drivers 102).

Second Preferred Embodiment

Figure 2:
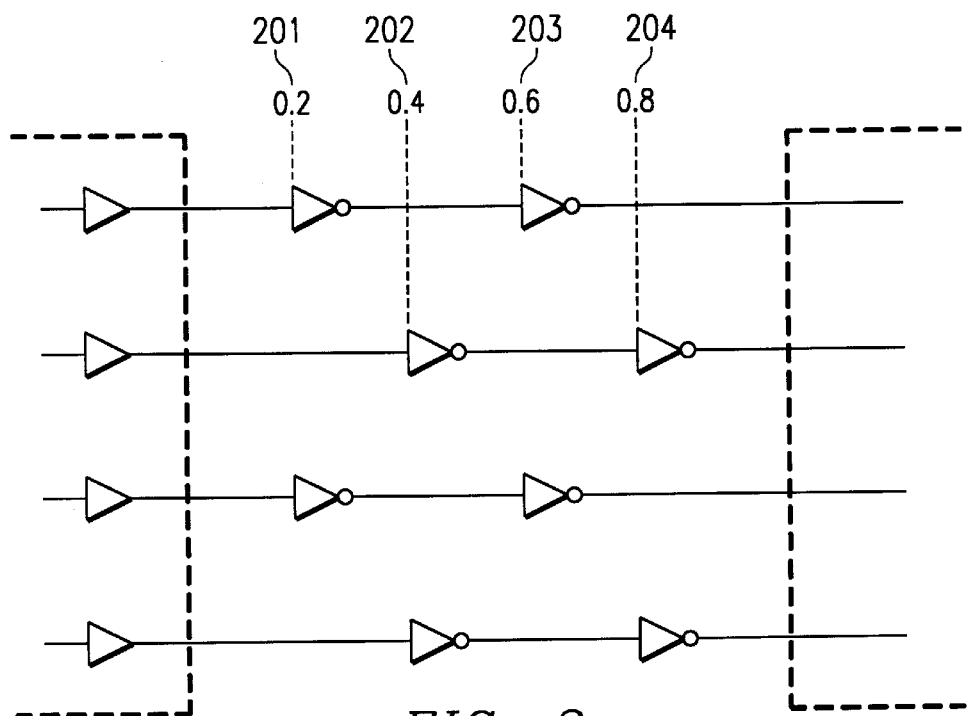
FIG. 2 shows a second set of transmission lines in which crosstalk is minimized.

FIG. 2 shows a second set of transmission lines in which crosstalk is minimized.

In a second preferred embodiment, both the first set of transmission lines 101 and the second set of transmission lines 101 have both balancing inverters 121 and restoring inverters 122. The balancing inverters 121 and the restoring inverters 122 are positioned on each transmission line 101 so as to minimize distances over which the first original signal 131 and the second original 132 are transmitted in parallel, while also minimizing a number of inverters which are required.

As shown in FIG. 2, each transmission line 101 in the first set of transmission lines 101 has a balancing inverter 121 positioned at a first part-way point 201, about one-fifth (20%) of the distance 112. Each transmission line 101 in the first set of transmission lines 101 has a restoring inverter 122 positioned at a second part-way point 202, about three-fifths (60%) of the distance 112.

Similarly, each transmission line 101 in the second set of transmission lines 101 has a balancing inverter 121 positioned at a third part-way point 203, about two-fifths (40%) of the distance 112. Each transmission line 101 in the second set of transmission lines 101 has a restoring inverter 122 positioned at a fourth part-way point 204, about four-fifths (80%) of the distance 112.

The embodiment shown in FIG. 2 is presently preferred by the inventor.

Figure 3:
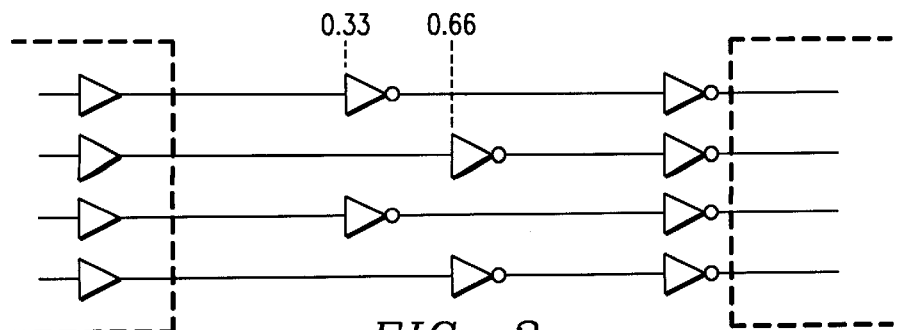
FIG. 3 shows a third set of transmission lines in which crosstalk is minimized.

FIG. 3 shows a third set of transmission lines in which crosstalk is minimized.

As shown in FIG. 3, each transmission line 101 in the first set of transmission lines 101 has a balancing inverter 121 positioned at a first part-way point 201, about one-third (about 33%) of the distance 112. Each transmission line 101 in the first set of transmission lines 101 has a restoring inverter 122 positioned at a second part-way point 202, nearly at the receiving point 104.

Similarly, each transmission line 101 in the second set of transmission lines 101 has a balancing inverter 121 positioned at a third part-way point 203, about two-thirds (about 66%) of the distance 112. Each transmission line 101 in the second set of transmission lines 101 has a restoring inverter 122 positioned at a fourth part-way point 204, nearly at the receiving point 104.

Figure 4:
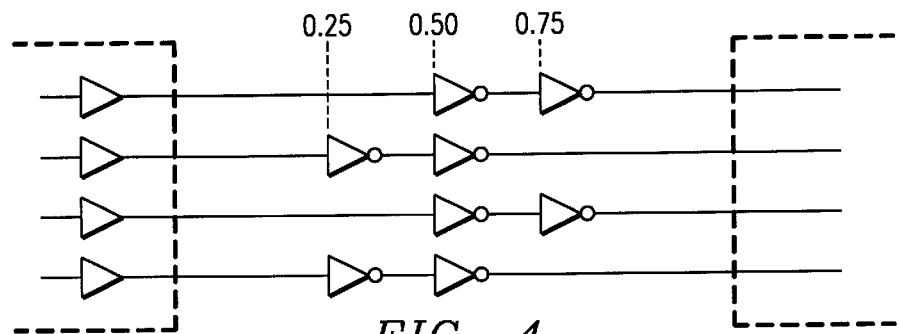
FIG. 4 shows a fourth set of transmission lines in which crosstalk is minimized.

FIG. 4 shows a fourth set of transmission lines in which crosstalk is minimized.

As shown in FIG. 4, each transmission line 101 in the first set of transmission lines 101 has a balancing inverter 121 positioned at a first part-way point 201, about one-half (50%) of the distance 112. Each transmission line 101 in the first set of transmission lines 101 has a restoring inverter 122 positioned at a second part-way point 202, about three-fourths (75%) of the distance 112.

Similarly, each transmission line 101 in the second set of transmission lines 101 has a balancing inverter 121 positioned at a third part-way point 203, about one-fourth (25%) of the distance 112. Each transmission line 101 in the second set of transmission lines 101 has a restoring inverter 122 positioned at a fourth part-way point 204, about one-half (50%) of the distance 112.

Figure 5:
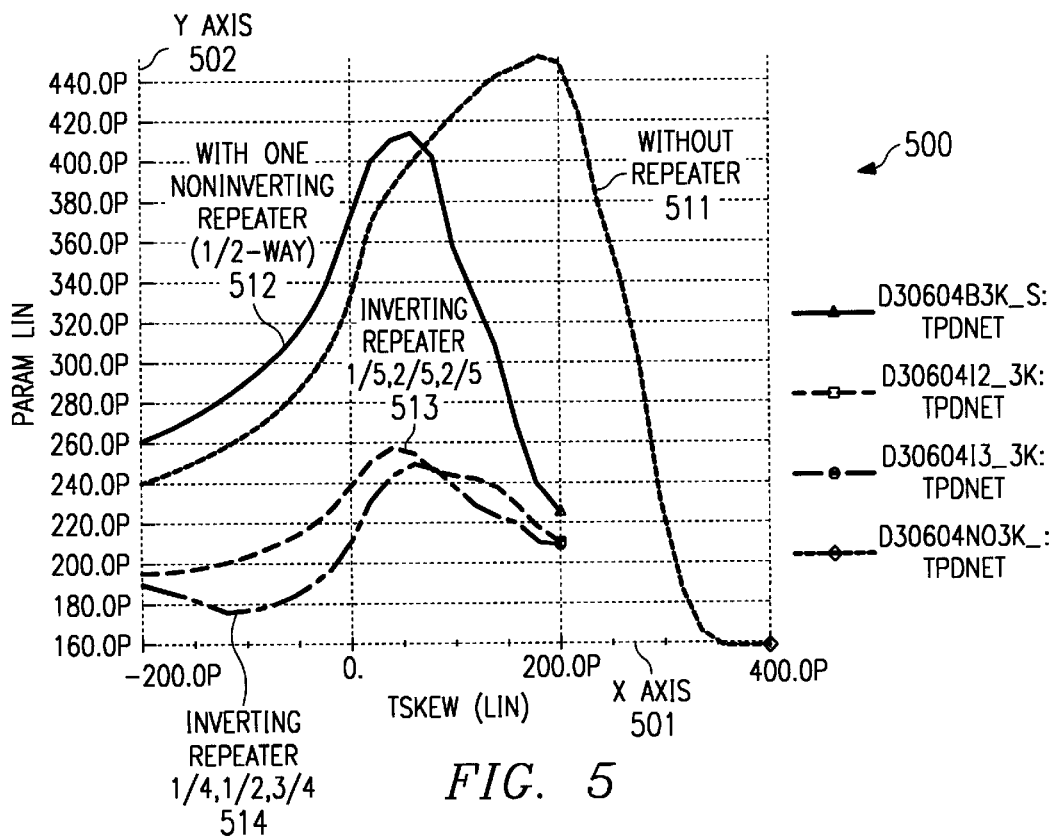
FIG. 5 shows a graphic plot of delay due to capacitive coupling.

FIG. 5 shows a graphic plot of delay due to capacitive coupling.

An graphic plot 500 comprises an X axis 501, a Y axis 502, and a plurality of plotted lines showing a simulated relation between an amount of skew between signal transitions on nearby transmission lines (such as wires) and the amount of delay induced by capacitive coupling.

The X axis 501 shows a measure of skew between signal transitions of the first original signal 131 on the first transmission line 101 and the second original signal 132 on the second transmission line 101. In the figure, the X axis 501 is shown marked using measures between about −200 picoseconds skew and about +400 picoseconds skew.

The Y axis 502 shows a measure of delay caused by capacitive coupling. In the figure, the Y axis 502 is shown marked using measures between about 160 picoseconds delay and about 440 picoseconds delay.

A first plot line 511 shows a measure of delay as a function of skew, for a pair of transmission lines comprising wires without repeaters or inverters.

A second plot line 512 shows a measure of delay as a function of skew, for a pair of transmission lines in which both transmission lines comprises a noninverting repeater positioned about one-half of the distance 112.

A third plot line 513 shows a measure of delay as a function of skew, for a pair of transmission lines using the configuration of FIG. 2. The maximum delay shown for the line 513 is significantly reduced from the maximum delays shown for the line 511 and the line 512.

A fourth plot line 514 shows a measure of delay as a function of skew, for a pair of transmission lines using the configuration of FIG. 4. The maximum delay shown for the line 514 is also significantly reduced from the maximum delays shown for the line 511 and the line 512.

Alternative Embodiments

Although preferred embodiments are disclosed herein, many variations are possible which remain within the concept, scope, and spirit of the invention, and these variations would become clear to those skilled in the art after perusal of this application.

I claim:

1. A circuit disposed on at least one side of a monolithic semiconductor chip said circuit comprising:
   a plurality of transmission lines, said plurality of transmission lines comprising a first plurality of transmission lines each of which has an input node and an output node for propagating a first original signal and a second plurality of transmission lines each of which has an input node and an output node for propagating a second original signal;
   each of said first plurality of transmission lines having a conductor coupled between said input node and said output node; and
   each of said second plurality of transmission lines having only a first inverter, a first conductor coupled between said input node and said first inverter, a second inverter, and a second conductor directly coupled between said first inverter and said second inverter, and a third conductor coupled between said second inverter and said output node.

2. A circuit as in claim 1, wherein said first plurality of transmission lines comprises half of said plurality of transmission lines.

3. A circuit as in claim 1, wherein said first inverter is disposed at a point half the distance between said input node and said output node.

4. A circuit as in claim 3, wherein said second inverter is disposed at said output node.

5. A circuit disposed on at least one side of a monolithic semiconductor chip said circuit comprising:
   a plurality of transmission lines, said plurality of transmission lines comprising a first plurality of transmission lines each of which has an input node and an output node and a second plurality of transmission lines each of which has an input node and an output node;
   each of said first plurality of transmission lines having one first inverter coupled between said input node and directly to one second inverter, and said one second inverter coupled directly between said first inverter and said output node; and
   each of said second plurality of transmission lines having one first inverter coupled between said input node and directly to one second inverter, and said one second inverter coupled directly between said first inverter and said output node.

6. A circuit as in claim 5, wherein said first inverter of said first plurality of transmission lines is located at a point one-fifth of a distance between said input node and said output node, said second inverter of said first plurality of transmission lines is located at a point three-fifths of said distance, said first inverter of said second plurality of transmission lines is located at a point two-fifths of said distance, and said second inverter of said second plurality of transmission lines is located at a point four-fifths of said distance.

7. A circuit as in claim 5, wherein said first inverter of said first plurality of transmission lines is located at a point one-third of a distance between said input node and said output node, said second inverter of said first plurality of transmission lines is located at said output node, said first inverter of said second plurality of transmission lines is located at a point two-thirds of said distance, and said second inverter of said second plurality of transmission lines is located at said output node.

8. A circuit as in claim 5, wherein said first inverter of said first plurality of transmission lines is located at a point one-half of a distance between said input node and said output node, said second inverter of said first plurality of transmission lines is located at a point three-fourths of said distance, said first inverter of said second plurality of transmission lines is located at a point one-fourth of said distance, and said second inverter of said second plurality of transmission lines is located at a point one-half of said distance.

9. A circuit as in claim 5, wherein said first plurality of transmission lines comprises half of said plurality of transmission lines.

10. A method of transmitting a plurality of signals through a plurality of transmission lines comprised of a first plurality of transmission lines and a second plurality of transmission lines in a circuit disposed on at least one side of a monolithic semiconductor chip, said method comprising the steps of
    selecting a first set of said signals and a second set of said signals;
    transmitting directly said first set of signals without change through said first plurality of transmission lines each of which has an input node and an output node from said input node to said output node; and
    transmitting directly said second set of signals through a second plurality of transmission lines each of which has an input node and an output node and inverting said second set of signals twice between said input node and said output node.

11. A method as in claim 10, wherein said first set of signals comprises half of said plurality of signals.

12. A method as in claim 10, wherein said step of inverting comprises the step of inverting said second set of signals once at a point halfway between said input node and said output node and a second time at said output node.

13. A method of transmitting a plurality of signals through a plurality of transmission lines comprised of a first plurality of transmission lines and a second plurality of transmission lines in a circuit disposed on at least one side of a monolithic semiconductor chip, said method comprising the steps of selecting a first set of said signals and a second set of said signals;

transmitting directly said first set of signals through said first plurality of transmission lines each of which has an input node and an output node, and inverting said first set of signals twice with a first inversion occurring between said input node and said output node and a second inversion occurring between said first inversion and said output node;

transmitting directly said second set of signals through said second plurality of transmission lines each of which has an input node and an output node, and inverting said second set of signals twice, with a first inversion occurring between said input node and said output node and a second inversion occurring between said first inversion and said output node.

14. A method as in claim 13, wherein said first inversion of said first set of signals occurs at one-fifth of a distance between said input node and said output node, said second inversion of said first set of signals occurs at three-fifths of said distance, said first inversion of said second set of signals occurs at two-fifths of said distance, and said second inversion of said second set of signals occurs at four-fifths of said distance.

15. A method as in claim 13, wherein said first inversion of said first set of signals occurs at one-third of a distance between said input node and said output node, said second inversion of said first set of signals occurs at said output node, said first inversion of said second set of signals occurs at two-thirds of said distance, and said second inversion of said second set of signals occurs at said output node.

16. A method as in claim 13, wherein said first inversion of said first set of signals occurs at one-half of a distance between said input node and said output node, said second inversion of said first set of signals occurs at three-fourths of said distance, said first inversion of said second set of signals occurs at one-fourth of said distance, and said second inversion of said second set of signals occurs at one-half of said distance.

17. A method as in claim 13, wherein said first set of signals comprises half of said plurality of signals.

\* \* \* \* \*